United States Patent
Baek et al.

(10) Patent No.: US 11,378,626 B2
(45) Date of Patent: Jul. 5, 2022

(54) SYSTEM AND METHOD FOR MANAGING BATTERY OF VEHICLE

(71) Applicants: HYUNDAI MOTOR COMPANY, Seoul (KR); KIA MOTORS CORPORATION, Seoul (KR)

(72) Inventors: Ki Seung Baek, Hwaseong-si (KR); Ik Jun Choi, Hwaseong-si (KR); Do Sung Hwang, Gunpo-si (KR); Kyung Taek Jung, Bucheon-si (KR); Chang Yu Kim, Bucheon-si (KR); Dea Ki Cheong, Yongin-si (KR); Tae Hyuck Kim, Seoul (KR); Han Seung Myoung, Chungcheongnam-do (KR); Ho Joong Lee, Anyang-si (KR); Hye Seung Kim, Gunpo-si (KR); Byoung Jik Ahn, Seoul (KR); Kyu Beom Ko, Incheon (KR); Hyo Sik Moon, Suwon-si (KR); Jong Seo Yoon, Incheon (KR); Sung Il Lee, Hwaseong-si (KR); Hong Min Oh, Yongin-si (KR); Jin Woo Cho, Anyang-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 4 days.

(21) Appl. No.: 17/110,983

(22) Filed: Dec. 3, 2020

(65) Prior Publication Data

US 2022/0011369 A1 Jan. 13, 2022

Related U.S. Application Data

(63) Continuation-in-part of application No. 17/109,621, filed on Dec. 2, 2020.

(30) Foreign Application Priority Data

Jul. 8, 2020 (KR) .................. 10-2020-0084030
Jul. 22, 2020 (KR) .................. 10-2020-0091120

(51) Int. Cl.
*G01R 31/36* (2020.01)
*G01R 31/382* (2019.01)
(Continued)

(52) U.S. Cl.
CPC ....... *G01R 31/3648* (2013.01); *G01R 31/382* (2019.01); *H01M 10/425* (2013.01); *H01M 10/48* (2013.01); *H01M 2010/4271* (2013.01)

(58) Field of Classification Search
None
See application file for complete search history.

(56) References Cited

U.S. PATENT DOCUMENTS 5,781,013 A 7/1998 Takahashi
5,869,951 A 2/1999 Takahashi
(Continued)

FOREIGN PATENT DOCUMENTS

CN 110065394 A 7/2019
EP 2295282 A2 3/2011
(Continued)

OTHER PUBLICATIONS

Song et al. ("Dynamic SOC Compensation of an Ultracapacitor Module for a Hybrid Energy Storage System" (2009) Journal of Power Electronics, p. 769-776) (Year: 2009).
(Continued)

*Primary Examiner* — Roy Y Yi
(74) *Attorney, Agent, or Firm* — Morgan, Lewis & Bockius LLP (57) ABSTRACT

A system for managing a battery of a vehicle includes a first controller configured to control a power-on (IG ON) state
(Continued)

and a power-off (IG OFF) state of a plurality of controllers in the vehicle and to be periodically woken up in the power-off (IG OFF) state to wake up at least some of the plurality of controllers, and a second controller configured to turn off a main relay connecting a first battery in the vehicle and a vehicle system when the power-off (IG OFF) state begins, to monitor a state of the first battery storing energy for generating power of the vehicle by maintaining power during a preset first reference time, to be woken up at a wake-up period of the first controller when the first reference time elapses, and to monitor the state of the first battery.

10 Claims, 5 Drawing Sheets

(51) Int. Cl.
*H01M 10/42* (2006.01)
*H01M 10/48* (2006.01)

(56) References Cited

U.S. PATENT DOCUMENTS

| | | | |
|---|---|---|---|
| 2012/0072144 A1 | 3/2012 | Zhang et al. |
| 2013/0207592 A1 | 8/2013 | Okada |
| 2014/0159670 A1 | 6/2014 | Lee et al. |
| 2016/0207415 A1 | 7/2016 | Sato et al. |
| 2017/0361791 A1 | 12/2017 | Yoon et al. |
| 2018/0115178 A1 | 4/2018 | Moon et al. |
| 2018/0260019 A1 | 9/2018 | Kim et al. |
| 2020/0180464 A1 | 6/2020 | Jang et al. |
| 2020/0185943 A1 | 6/2020 | Youn et al. |
| 2020/0233450 A1 | 7/2020 | Giri et al. |

FOREIGN PATENT DOCUMENTS

| | | |
|---|---|---|
| JP | H08-126104 A | 5/1996 |
| JP | 2003-063330 A | 3/2003 |
| JP | 2007-230398 A | 9/2007 |
| KR | 10-2010-0085791 A | 7/2010 |
| KR | 10-2013-0061964 A | 6/2013 |
| KR | 10-1477272 B1 | 1/2015 |
| KR | 10-2018-0056091 A | 5/2018 |

OTHER PUBLICATIONS

U.S. Office Action dated Dec. 8, 2021, issued in corresponding U.S. Appl. No. 17/109,621.
Extended European Search Report dated Oct. 6, 2021, issued in corresponding European Patent Application No. 20211178.7.
Extended European Search Report dated May 28, 2021 issued in European Patent Application No. 20211495.5.

SYSTEM AND METHOD FOR MANAGING BATTERY OF VEHICLE

CROSS-REFERENCE TO RELATED APPLICATION

This application is a Continuation-In-Part of U.S. patent application Ser. No. 17/109,621, filed on Dec. 2, 2020 which claims the priority benefit of Korean Patent Application No. 10-2020-0084030, filed on Jul. 8, 2020, in the Korean Intellectual Property Office, and this application claims the priority benefit of Korean Patent Application No. 10-2020-0091120, filed on Jul. 22, 2020 in the Korean Intellectual Property Office. The disclosures of U.S. patent application Ser. No. 17/109,621, Korean Patent Application No. 10-2020-0084030, and Korean Patent Application No. 10-2020-0091120 are incorporated herein by reference.

TECHNICAL FIELD

The present disclosure relates to a system and method of managing a battery of a vehicle, and more particularly to a system and method of managing a battery of a vehicle to preemptively prevent various problems that occur in a battery in a power-off (IG OFF) state by effectively monitoring the state of the battery in the state in which vehicle driving is terminated and controllers in the vehicle are powered off.

BACKGROUND

In general, an eco-friendly vehicle driven using electric energy generates power by driving a motor, which is an electric rotary device using electric energy stored in a battery. The dynamic performance of the eco-friendly vehicle is strongly related to the performance of a battery, and thus the battery needs to be effectively monitored and managed.

In general, a battery of an eco-friendly vehicle is managed by a controller that is commonly called a battery management system (BMS). The BMS calculates various parameters for managing a battery by collecting, from the battery, various pieces of information (battery voltage, battery current, or battery temperature) for managing the battery and applying the collected information to various pre-stored algorithms.

A conventional scheme of managing a battery of a vehicle is mainly performed in the state in which power is supplied to a BMS, that is, in a power-on (IG ON) state. That is, a main relay connected to a battery monitors the state of the battery in the state in which the electrical connection between the battery and other components (e.g., a power module for converting the power of the battery and providing the power or a charger for generating power for charging the battery) of a vehicle is formed.

As such, in the conventional scheme of managing a battery of a vehicle, information for managing the battery is collected in the state in which an electrical connection between the battery and other components is formed, and thus there is a problem in that the state of the battery is not accurately monitored due to influence of the other components on the collected information.

When only a battery management system (BMS) is in a wake-up state in a power-off state, if the battery is continuously monitored, power is continuously consumed in the state in which a battery of a vehicle is not charged, and thus, a scheme appropriate for monitoring the battery in the power-off state is not conventionally applied.

It will be understood that the above matters described in the related art are merely for promotion of understanding of the background of the disclosure, and should not be recognized as prior art that is well-known to those skilled in the art.

SUMMARY

Therefore, the present disclosure has been made in view of the above problems, and it is an object of the present disclosure to provide a system and method of managing a battery of a vehicle to preemptively prevent accidents such as combustion of a battery by efficiently monitoring the battery in the state in which the vehicle is turned off.

In accordance with an aspect of the present disclosure, the above and other objects can be accomplished by the provision of a system for managing a battery of a vehicle, including a first controller configured to control a power-on (IG ON) state and a power-off (IG OFF) state of a plurality of controllers in the vehicle and to be periodically woken up in the power-off (IG OFF) state to wake up at least some of the plurality of controllers, and a second controller configured to turn off a main relay connecting a first battery in the vehicle and a vehicle system when the power-off (IG OFF) state begins, to monitor a state of the first battery storing energy for generating power of the vehicle by maintaining power during a preset first reference time, to be woken up at a wake-up period of the first controller when the first reference time elapses, and to monitor the state of the first battery.

The second controller may set the wake-up period of the first controller.

The second controller may set the wake-up period of the first controller to a first wake-up period during a preset second reference time from a time at which the power-off (IG OFF) state begins, and may set the wake-up period of the first controller to a second wake-up period, which is longer than the first wake-up period, after the second reference time elapses.

The second controller may stop and initializes monitoring of the first battery, performed in the power-off (IG OFF) state, when a main relay connected to the first battery is turned on.

After turning off the main relay, the second controller may not monitor a state of the first battery when not allowed to check a state of charge (SoC) of a second battery for providing power voltage of the first controller and the second controller, when a SoC of the first battery is lower than a preset reference, or when not allowed to communicate with a low voltage DC-DC converter (LDC) or the first controller for dropping a voltage of the first battery and applying the voltage to the second battery.

In accordance with another aspect of the present disclosure, there is provided a method of managing a battery of a vehicle, the method including, when receiving an external input for terminating vehicle driving, controlling a plurality of controllers in the vehicle in a power-off (IG OFF) state, by a first controller, turning off a main relay connected to a first battery storing energy for generating driving power of the vehicle while maintaining power, by a second controller, a first monitoring operation of setting a wake-up period of the first controller, and monitoring a state of the first battery of the vehicle by maintaining power during a preset first reference time, by the second controller, and a second monitoring operation of, when the first reference time elapses, being woken up at the wake-up period of the first controller, and monitoring the state of the first battery, by the second controller.

The method may further include, after the turning off the main relay, determining not to perform the first monitoring operation by the second controller when not allowed to check a state of charge (SoC) of a second battery for providing power voltage of the first controller and the second controller, when a SoC of the first battery is lower than a preset reference, or when not allowed to communicate with a low voltage DC-DC converter (LDC) or the first controller for dropping a voltage of the first battery and applying the voltage to the second battery.

The first monitoring operation may include determining the wake-up period of the first controller to a preset first wake-up period, by the second controller, and the second monitoring operation may include being woken up by the first controller woken up at the first wake-up period during a preset second reference time at a time when the first reference time elapses, and setting the wake-up period of the first controller to a second wake-up period longer than the first wake-up period and being woken up by the first controller woken up at the second wake-up period after the second reference time elapses, by the second controller.

The first monitoring operation may include checking whether the main relay is turned on when the second controller is controlled in a power-on (IG ON) state by the first controller, and terminating monitoring of the state of the first battery when the main delay is turned on, by the second controller.

The second monitoring operation may include, after being woken up, determining a reason of wake-up and monitoring the state of the first battery when the determined reason is the wake-up period set by the first controller, by the second controller.

The second monitoring operation may include, after being woken up, determining a reason of wake-up, checking whether the main relay is turned on when the determined reason is the external input rather than the wake-up period set by the first controller, and terminating monitoring of the state of the first battery when the main relay is turned on, by the second controller.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Hereinafter, a system and method of managing a battery will be described with regard to exemplary embodiments of the disclosure with reference to the attached drawings.

Figure 1:
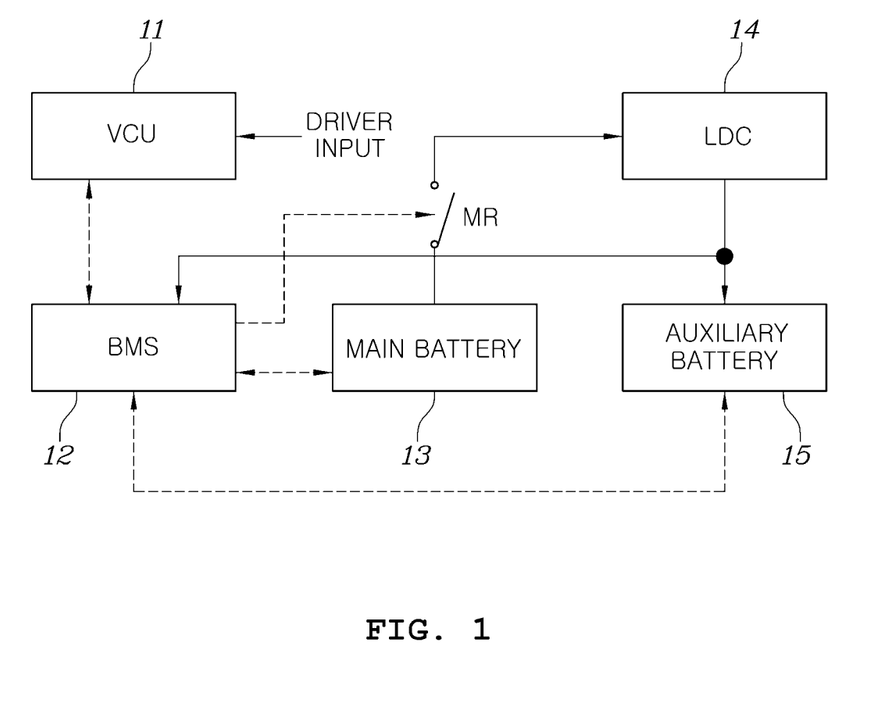
FIG. 1 is a block diagram showing a configuration of a system for managing a battery of a vehicle according to an embodiment of the present disclosure.

FIG. 1 is a block diagram showing a configuration of a system for managing a battery of a vehicle according to an embodiment of the present disclosure.

Referring to FIG. 1, the system for managing a battery of a vehicle according to an embodiment of the present disclosure may include a first controller 11 that controls power-on (IG ON) and power-off (IG OFF) states of a plurality of controllers in the vehicle and is periodically woken up in the power-off state to wake up at least some of the plurality of controllers, and a second controller 12 that turns on a main relay (MR) for connecting a first battery 13 in the vehicle with a vehicle system when the power-off state begins, maintains power during a preset first reference time to monitor the state of the first battery 13 in the vehicle, and is woken up at a wake-up interval of the first controller 11 when the first reference time elapses and monitors the state of the first battery 13.

As shown in FIG. 1, the first controller 11 may be embodied as a vehicle control unit (VCU) for controlling the overall operation of the vehicle, and the second controller may be embodied as a controller, known as a battery management system (BMS), that mainly monitors the state of a battery and controls the state of the battery using a main relay (MR) connected to the battery.

The first battery 13 may be a main battery (or a high-voltage battery) of a vehicle, which supplies energy to a driving motor for generating power of the vehicle or is charged by receiving energy via regeneration of the driving motor.

In FIG. 1, reference numeral '14' may be a low voltage DC-DC converter (LDC) for dropping a high voltage of the main battery 13 down to a low voltage corresponding to power of an electric load, and reference numeral '15' may be an auxiliary battery 15 or a low voltage battery that is charged by receiving the voltage converted by the LDC and supplies power voltage to various controllers in the vehicle.

According to an embodiment of the present disclosure, the first controller 11 may control a power-on (IG ON) or power-off (IG OFF) state of a plurality of controllers in the vehicle based on a signal input from the outside. For example, in the power-off (IG OFF) state, when a driver generates input of pressing an ignition button of the vehicle, the first controller 11 may recognize the input and may supply power to a plurality of other controllers in the vehicle to switch the current state to the power-on (IG ON) state. In contrast, in the power-on (IG ON) state, when the driver generates an input of pressing the ignition button of the vehicle, the first controller 11 may recognize the input and may block power to the plurality of other controllers in the vehicle to switch the current state to the power-off (IG OFF) state.

The second controller 12 may be operated in consideration of the power-on (IG ON) or power-off (IG OFF) state, controlled by the first controller 11, and when vehicle driving is terminated by driver input, the first battery 13 may be monitored after a main relay (MR) is turned off while the power-on (IG ON) state is maintained for a predetermined time using a power-latch function installed in the vehicle immediately after switching from the power-on (IG ON) state to the power-off (IG OFF) state.

Here, the power-latch function may be a function of maintaining the state in which the second controller 12 supplies power for a predetermined time using a power line that is connected directly to the second battery 15 as necessary even if power-off (IG OFF) of the first controller 11 is controlled.

Monitoring by the second controller 12 may be performed to check for the occurrence of a problem in the first battery 13 after vehicle driving is terminated, and the problem may mainly be detected through measurement of an insulation resistance value of the first battery 13, a voltage difference between battery cells included in the first battery 13, a degree of deterioration of the first battery 13, or the like. Derivation or calculation of insulation resistance of a battery, a voltage difference between battery cells, and a degree of deterioration of the battery may be performed by employing some of various schemes known to the art to which the present disclosure pertains.

The second controller 12 may set a wake-up period of the first controller 11 and may calculate a reference time for changing setting of the wake-up period of the first controller 11 using a counter installed in the vehicle after the power-off (IG OFF) state begins.

Figure 2:
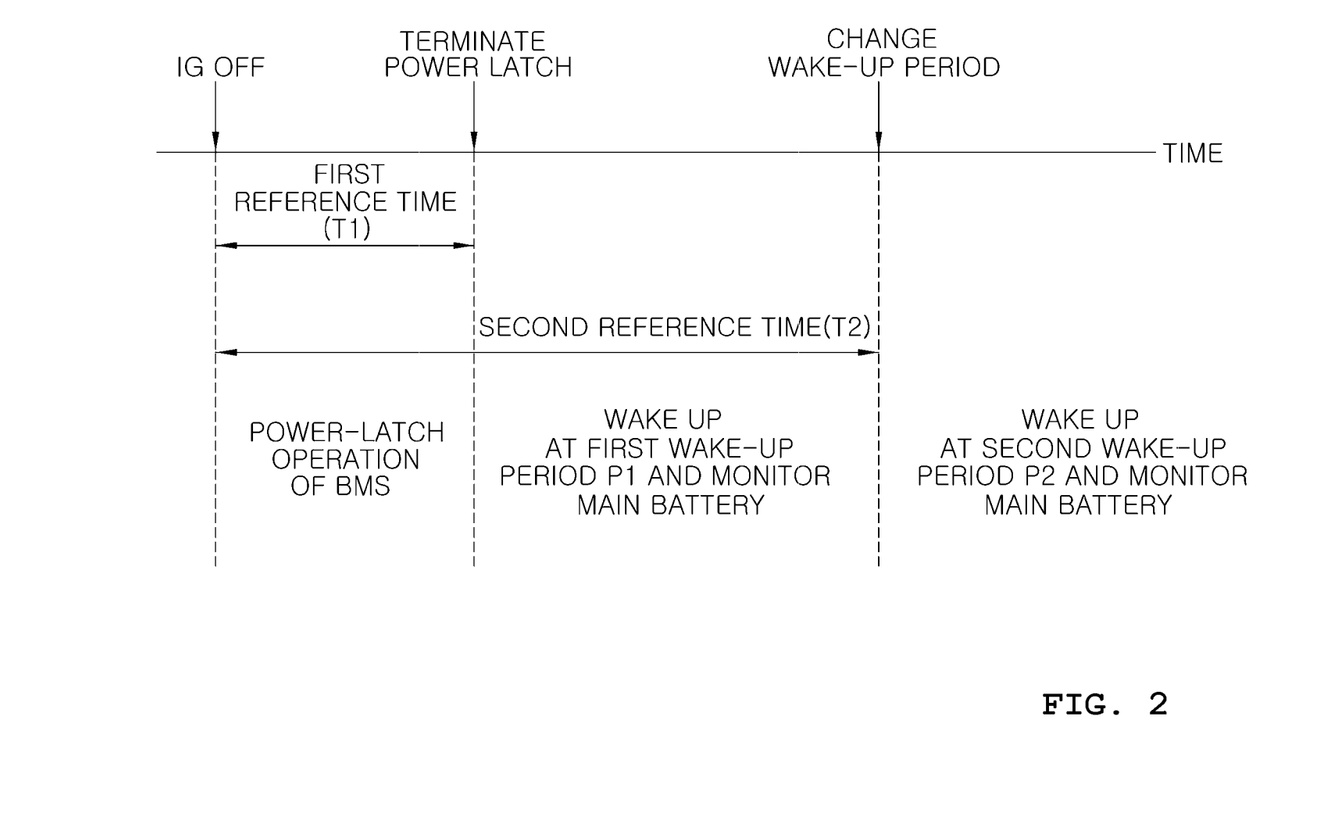
FIG. 2 is a diagram showing a procedure for performing monitoring over time by a system for managing a battery of a vehicle according to an embodiment of the present disclosure.

FIG. 2 is a diagram showing a procedure for performing monitoring over time by a system for managing a battery of a vehicle according to an embodiment of the present disclosure.

When driver input of terminating vehicle driving is generated, the first controller 11 may start the power-off (IG OFF) state of powering off a plurality of controllers in the vehicle. As such, when the power-on (IG ON) state is switched to the power-off (IG OFF) state, the power-off (IG OFF) state may begin, and simultaneously, the second controller 12 may perform a power latch operation and may monitor the first battery 13 during a first reference time T1 while maintaining power. For example, the first reference time T1 may be preset to about several hours.

Various embodiments of the present disclosure may be embodied to monitor the state of the first battery 13, and thus, the second controller 12, which is the entity that monitors the first battery 13, may set the wake-up period of the first battery 13.

In particular, the second controller 12 may set the wake-up period of the first controller 11 to a first wake-up period P1 during a preset second reference time T2 from the time at which the power-on (IG ON) state is switched to the power-off (IG OFF) state, that is, the time at which the power-off (IG OFF) state begins, and may set the wake-up period of the first controller 11 to a second wake-up period P2, which is longer than the first wake-up period P1, after the second reference time T2 elapses.

For example, the second reference time T2 may be about several days, the first wake-up period P1 may be several hours, and the second wake-up period P2 may be several tens of hours to several days.

In summary, the first controller 11 may be woken up at the first wake-up period P1 during the second reference time T2 to wake up the second controller 12, and the woken up second controller 12 may monitor the state of a battery. The time for which wake-up is maintained may be appropriately preset by the second controller 12 depending on the time for which the battery is monitored.

When the second reference time T2 elapses, the first controller 11 may be woken up at the second wake-up period P2, which is longer than the first wake-up period P1, and may then wake up the second controller 12.

The second controller 12 may calculate the first reference time T1 and the second reference time T2 using a counter (not shown) installed in the vehicle. Here, the first reference time T1 and the second reference time T2 may be appropriately changed depending on the state of charge (SoC) or the degree of deterioration of the second battery 15, which supplies power voltage to the first controller 11 and the second controller 12, or a SoC or a degree of deterioration of the first battery 13 that supplies energy for charging the second battery 15 through the LDC 14. For example, when a SoC or a degree of deterioration of the first battery 13 or the second battery 15 is lower than a reference value, the first reference time T1 and the second reference time T2 may be set to be relatively short, and in contrast, when the SoC or the degree of deterioration is higher than the reference value, the first reference time T1 and the second reference time T2 may be set to be relatively long.

The first reference time T1, the second reference time T2, the first wake-up period P1, and the second wake-up period P2, which are described above, may be preset values, and in order to set the values, the capacitance and the degree of deterioration of the second battery 15, which supplies power voltage to controllers, the capacitance of the first battery 13, which stores energy for charging the second battery 15, the fuel efficiency of a vehicle, and the like may be considered.

Various embodiments of the present disclosure may be embodied to monitor the first battery 13 in the state in which the first battery 13 is not connected to a vehicle system, that is, in the state in which a main relay (MR) is open. Thus, when the state in which the first battery 13 is not connected to a vehicle system is maintained, the aforementioned monitoring may be performed over time. When an electrical connection state of the first battery 13 is changed during the aforementioned monitoring procedure, that is, when the main relay (MR) is turned on (is short-circuited), battery monitoring according to various embodiments of the present disclosure may be stopped and the monitoring procedure may be initialized, and when the main relay (MR) is turned off again, an initial procedure (i.e., continuous monitoring using power latch of the second controller 12) for battery monitoring may begin again.

When a driver generates input for terminating vehicle driving by pressing an ignition button of the vehicle in the state in which the vehicle is parked, and thus the first controller 11 controls vehicle controllers in the power-off (IG OFF) state, the second controller 12 may turn off the main relay (MR) while maintaining power using a power-latch function and may then determine whether the requirement for monitoring the first battery 13 is satisfied.

Here, as the requirement for monitoring the first battery 13, whether the state of charge (SoC) of the second battery 15 is calculated, the SoC of the first battery 13, the communication state between controllers, and the like may be considered.

For example, when the second controller 12 is not capable of checking the SoC of the second battery 15, which supplies power to the controllers 11 and 12, the first controller 11 and the second controller 12 may not be capable of checking whether it is possible to supply a sufficient amount of power for monitoring the first battery 13 in the state in which the second battery 15 is not charged, and thus monitoring may not be performed.

When the SoC of the second battery 15 is lower than a preset reference, the LDC 14 may be operated, and the second battery 15 may be charged with the energy stored in the first battery 13 to perform battery monitoring afterwards, and in connection therewith, when the SoC of the first battery 13 is not sufficient, if the second battery 15 is charged, the SoC of the first battery 13 may be further lowered, and it may subsequently become impossible to drive the vehicle. Thus, when the SoC of the first battery 13 is lower than the preset reference, monitoring may not be performed.

In the state in which communication (e.g., CAN communication) between the first controller 11 and the second controller 12 or the second controller 12 and the LDC 14 is not possible (e.g., CAN timeout), it is not possible to exchange various data required to perform monitoring, and thus monitoring may not be performed.

Figure 3:
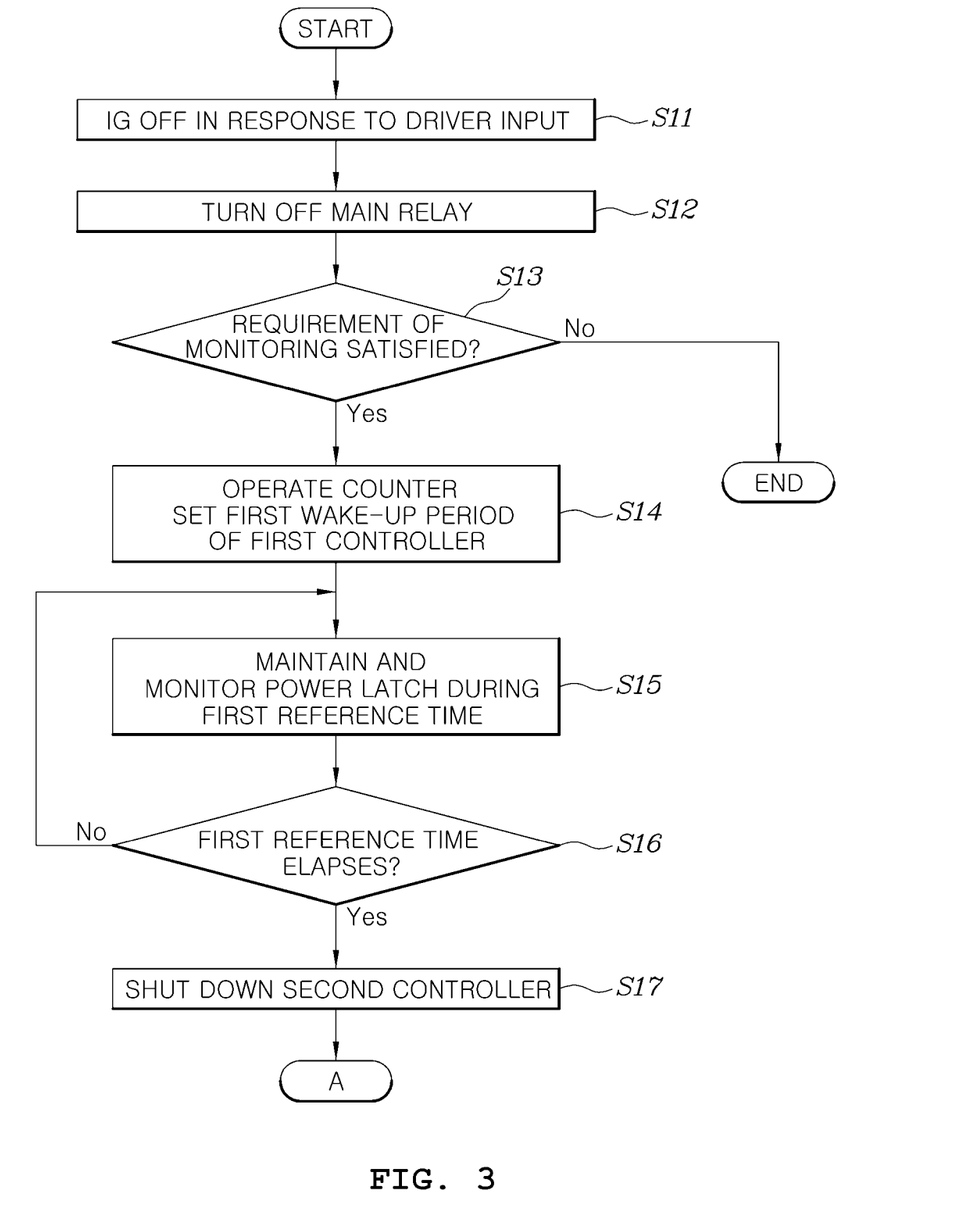
FIGS. 3 to 5 are flowcharts showing a method of managing a battery of a vehicle according to an embodiment of the present disclosure.
Figure 4:
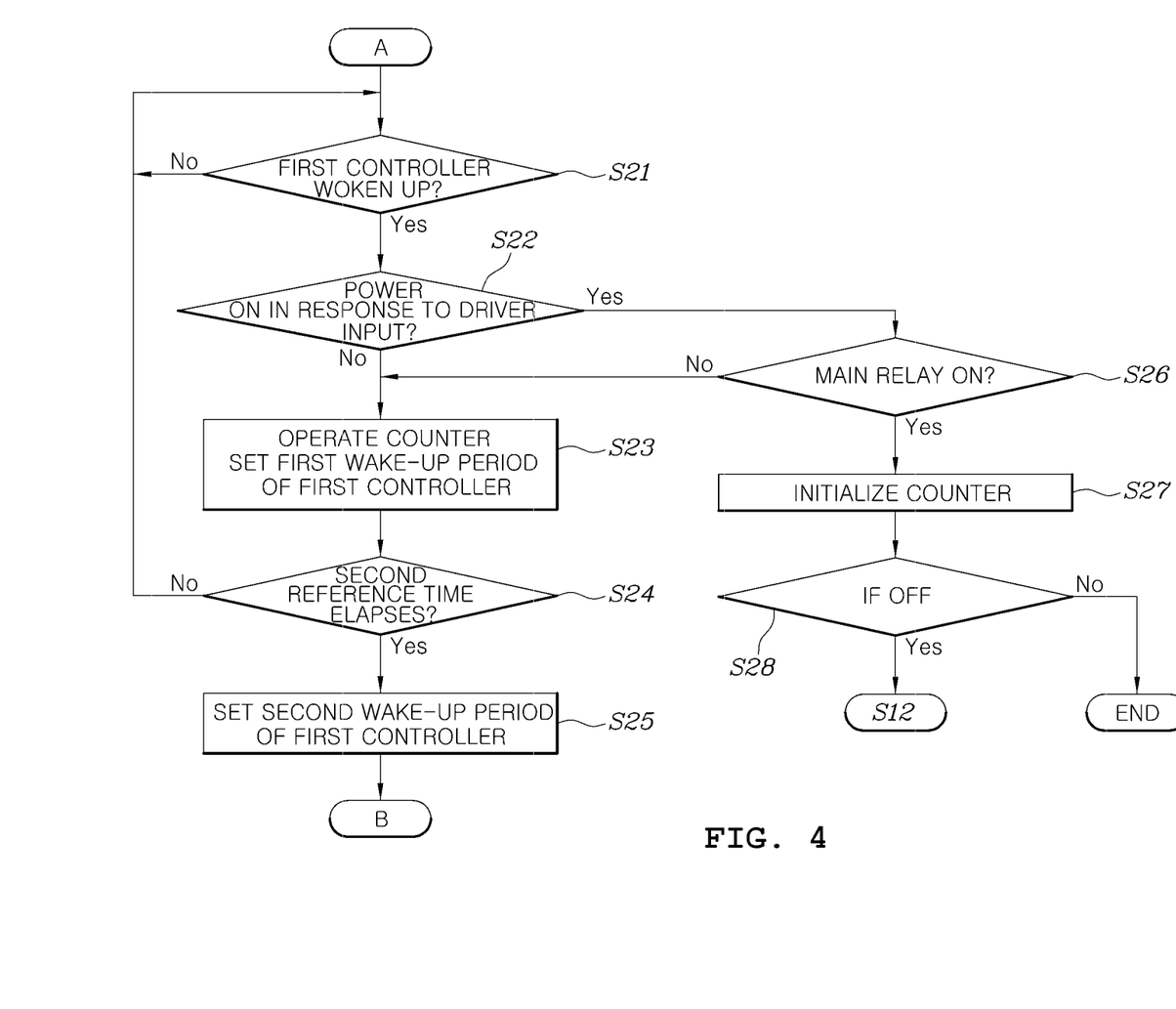
Figure 5:
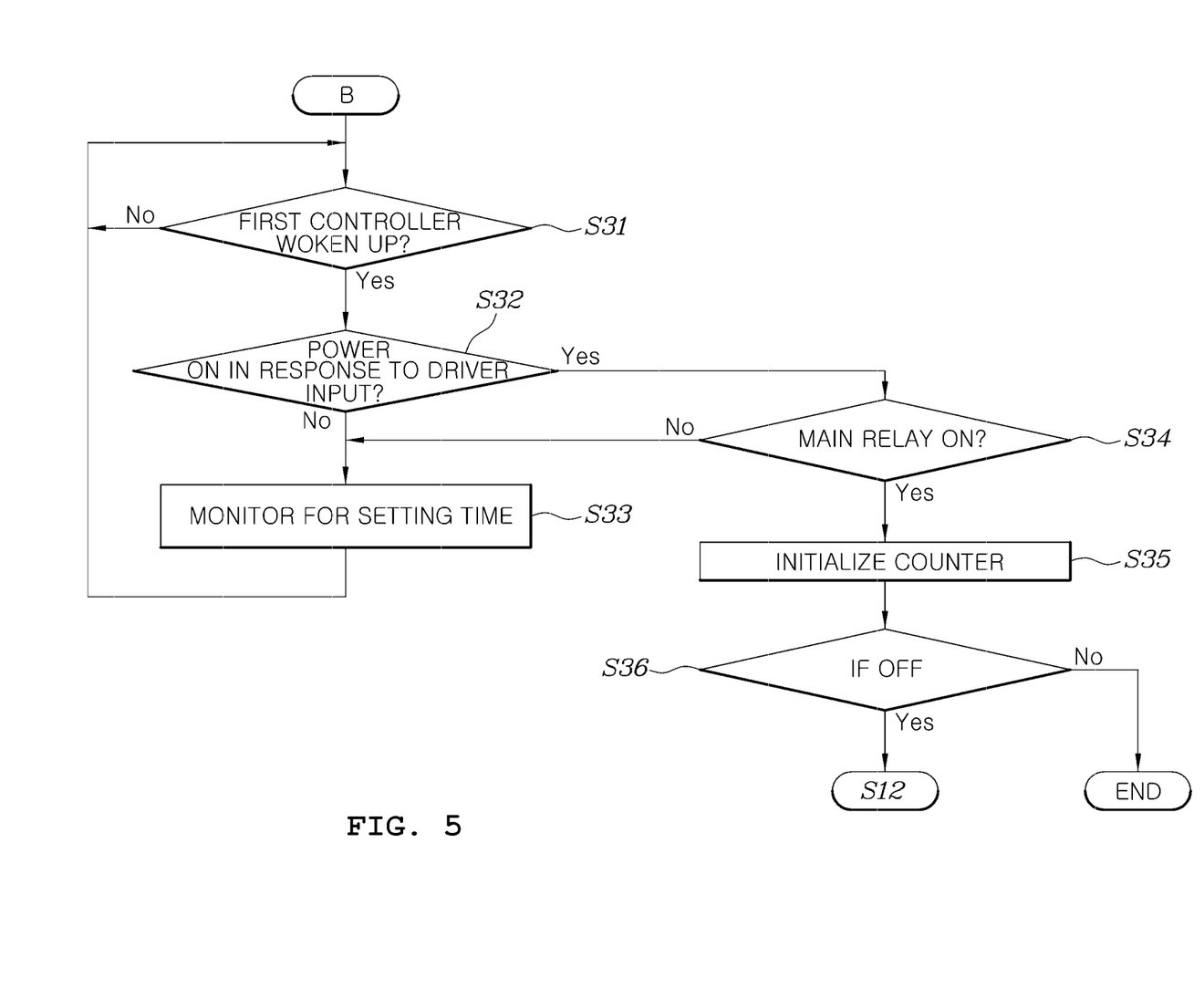

FIGS. 3 to 5 are flowcharts showing a method of managing a battery of a vehicle according to an embodiment of the present disclosure. The method of managing a battery of a vehicle according to an embodiment of the present disclosure may be embodied by the aforementioned system for managing a battery of a vehicle according to an embodiment of the present disclosure.

Referring to FIGS. 3 to 5, first, when driver input for terminating vehicle driving is generated in the state in which the vehicle is stopped, the first controller 11 may start operation (S11) of powering off a controller in the vehicle.

When the current state is switched to the power-off (IG OFF) state by the first controller 11, the second controller 12 may turn off the main relay (MR) while maintaining power using a power-latch function (S12), and whether the requirement for monitoring is satisfied in the state in which the main relay (MR) is turned off may be checked (S13).

In operation S13, the second controller 12 may determine not to perform monitoring when it is not possible to check the SoC of the second battery 15, which supplies power voltage to the first controller 11 and the second controller 12, the SoC of the first battery 13 is lower than a preset reference, or it is not possible to communicate with the LDC 14 or the first controller 11 for dropping the voltage of the first battery 13 and applying the dropped voltage to the second battery 15.

In operation S13, when the requirements for performing monitoring are satisfied, the second controller 12 may operate a counter to calculate a time and may set the first wake-up period P1 of the first controller 11 to wake up the first controller 11 at the first wake-up period P1 (S14).

Then, the second controller 12 may maintain a power-latch function during the preset first reference time T1, and may continuously monitor the state of the first battery 13 (S15). As described above, in a procedure of monitoring the state of the first battery 13, insulation resistance of the first battery 13, a voltage difference between battery cells included in the first battery 13, or the degree of deterioration of the first battery 13 may be calculated, the calculated values may be compared with preset respective reference values, and the state of the first battery 13 may be monitored.

When a first reference time, during which the second controller 12 continuously monitors the state of the first battery 13, has elapsed (S16), the second controller 12 may terminate a power-latch function and may be shut down (S17). Then, the second controller 12 may be woken up again by waking up the first controller 11.

Although not shown, when the first controller 11 is woken up while the second controller 12 performs monitoring on the first battery 13 in the state in which power is maintained using a power-latch function during the first reference time T1, the second controller 12 may check whether the main relay (MR) is turned on, and when the main relay (MR) is turned on, the counter may be initialized and the monitoring that is currently being performed may be stopped.

When the first controller 11 is woken up after the first reference time T1 elapses, the first controller 11 may supply power to the second controller 12 to wake up the second controller 12 (S21). In this case, the first controller 11 may provide information indicating whether the corresponding wake-up is performed at a preset first wake-up period or is performed in response to driver input, to the second controller 12.

When the second controller 12 is woken up, whether the second controller 12 is woken up by supplying power in response to driver input may be determined based on the information received from the first controller 11 (S22). When the second controller 12 is woken up at the first wake-up period P1, the state of the first battery 13 may be monitored and the first battery 13 may be shut down during a preset time (S23). Such periodic monitoring at the first wake-up period P1 may be continuously performed until the preset second reference time T2 has elapsed (S24).

In operation S24, when determining that the second reference time T2 elapses based on the time counted by the counter, the second controller 12 may set the wake-up period of the first controller 11 to the second wake-up period P2, which is longer than the first wake-up period P1, and may transmit information thereon to the first controller 11 (S25).

When the first controller 11 is woken up and switched to the power-on (IG ON) state (S21) and the reason for switching to the power-on (IG ON) state is determined to be driver input rather than periodic wake-up at the first wake-up period P1 (S22), the second controller 12 may determine whether the current situation is a situation in which the main relay (MR) needs to be turned on, and when the main relay (MR) is turned on (S26), the counter may be initialized (S27). That is, the state of the first battery 13 may be changed when the first battery 13 is connected to a vehicle system by turning on the main relay (MR), and monitoring of the first battery 13, which is previously performed, may be terminated.

When the current state is switched again to the power-off (IG OFF) state by the first controller 11 after the counter is initialized (S27), the method may proceed to operation S12 to perform the aforementioned monitoring procedure again from the start. When the current state is not switched to the power-off (IG OFF) state again and vehicle driving begins after the counter is initialized (S27), the monitoring procedure may be terminated until the current state is switched to a next power-off (IG OFF) state.

In the aforementioned operation S25, after the wake-up period of the first controller 11 is set to the second wake-up period P2, the first controller 11 may be woken up every second wake-up period P2 to supply power to the second controller 12.

When the first controller 11 is woken up after the second reference time T2 elapses, the first controller 11 may supply power to the second controller 12 to wake up the second controller 12 (S31). In this case, the first controller 11 may provide information, indicating whether the corresponding wake-up is performed at a preset first wake-up period or is performed in response to driver input, to the second controller 12.

When the second controller 12 is woken up, whether the second controller 12 is woken up by supplying power in response to driver input may be determined based on the information received from the first controller 11 (S32), and when the second controller 12 is woken up at the second wake-up period P2, the state of the first battery 13 may be monitored and the first battery 13 may be shut down during a preset time (S33).

When the first controller 11 is woken up and is switched to the power-on (IG ON) state (S31) and the reason for switching to the power-on (IG ON) state is determined to be driver input rather than periodic wake-up at the second wake-up period P2 (S32), the second controller 12 may determine whether the current situation is a situation in which the main relay (MR) needs to be turned on (S34). When the main relay (MR) is turned on (S34), the counter may be initialized (S35). That is, the state of the first battery 13 may be changed as the first battery 13 is connected to a vehicle system by turning on the main relay (MR), and monitoring of the first battery 13, which is performed up to that point in time, may be terminated.

When the current state is switched again to the power-off (IG OFF) state by the first controller 11 (S36) after the counter is initialized (S35), the method may proceed to operation S12 of performing the aforementioned monitoring procedure again from the start. When the current state is not switched to the power-off (IG OFF) state again and vehicle driving begins after the counter is initialized (S35), the monitoring procedure may be terminated until the current state is switched to the next power-off (IG OFF) state.

The first controller 11 may include a processor or a microprocessor. In addition, the first controller 11 may also include a memory. The aforementioned operations/functions of the first controller 11 can be embodied as computer readable code/algorithm/software stored on the memory thereof which may include a non-transitory computer readable recording medium. The non-transitory computer readable recording medium is any data storage device that can store data which can thereafter be read by the processor or the microprocessor. Examples of the computer readable recording medium include a hard disk drive (HDD), a solid state drive (SSD), a silicon disc drive (SDD), read-only memory (ROM), random-access memory (RAM), CD-ROM, magnetic tapes, floppy disks, optical data storage devices, etc. The processor or the microprocessor may perform the above described operations/functions of the first controller 11, by executing the computer readable code/algorithm/software stored on the non-transitory computer readable recording medium.

Similarly, the second controller 12 may include a processor or a microprocessor. In addition, the second controller 12 may also include a memory. The aforementioned operations/functions of the second controller 12 can be embodied as computer readable code/algorithm/software stored on the memory thereof which may include a non-transitory computer readable recording medium. The processor or the microprocessor may perform the above described operations/functions of the second controller 12, by executing the computer readable code/algorithm/software stored on the non-transitory computer readable recording medium.

As described above, the system and method of managing a battery of a vehicle according to the various embodiments of the present disclosure may preemptively prevent problems that occur in a battery, such as combustion of a battery, in advance by monitoring the state of the battery even in a power-off (IG OFF) state, in which the electrical connection between the battery of the vehicle and a vehicle system is blocked and all controllers are powered off.

In particular, the system and method of managing a battery of a vehicle according to the various embodiments of the present disclosure may efficiently monitor the state of the battery while minimizing power consumption in a power-off (IG OFF) state by appropriately determining the number of times the battery is monitored over time after the power-off (IG OFF) state begins.

The system and method of managing a battery of a vehicle may preemptively prevent problems that occur in a battery, such as combustion of a battery, by monitoring the state of the battery even in a power-off (IG OFF) state, in which the electrical connection between the battery of the vehicle and a vehicle system is blocked and all controllers are powered off.

In particular, the system and method of managing a battery of a vehicle may efficiently monitor the state of the battery while minimizing power consumption in a power-off (IG OFF) state by appropriately determining the number of times the battery is monitored over time after the power-off (IG OFF) state begins.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A system for managing a battery of a vehicle, comprising:
    a first controller configured to control a power-on (IG ON) state and a power-off (IG OFF) state of a plurality of controllers in the vehicle and to be periodically woken up in the power-off (IG OFF) state to wake up at least some of the plurality of controllers; and
    a second controller configured to turn off a main relay connecting a first battery in the vehicle and a vehicle system when the power-off (IG OFF) state begins, to monitor a state of the first battery storing energy for generating power of the vehicle by maintaining power during a preset first reference time, to be woken up at a wake-up period of the first controller when the first reference time elapses, and to monitor the state of the first battery,
    wherein, after turning off the main relay, the second controller does not monitor a state of the first battery when not allowed to check a state of charge (SoC) of a second battery for providing power voltage of the first controller and the second controller, when a SoC of the first battery is lower than a preset reference, or when not allowed to communicate with a low voltage DC-DC converter (LDC) or the first controller for dropping a voltage of the first battery and applying the voltage to the second battery.

2. The system of claim 1, wherein the second controller sets the wake-up period of the first controller.

3. The system of claim 2, wherein the second controller sets the wake-up period of the first controller to a first wake-up period during a preset second reference time from a time at which the power-off (IG OFF) state begins, and sets the wake-up period of the first controller to a second wake-up period, which is longer than the first wake-up period, after the second reference time elapses.

4. The system of claim 1, wherein the second controller stops and initializes monitoring of the first battery, performed in the power-off (IG OFF) state, when a main relay connected to the first battery is turned on.

5. A method of managing a battery of a vehicle, the method comprising:
    when receiving an external input for terminating vehicle driving, controlling a plurality of controllers in the vehicle in a power-off (IG OFF) state, by a first controller;
    turning off a main relay connected to a first battery storing energy for generating driving power of the vehicle while maintaining power, by a second controller;
    a first monitoring operation of setting a wake-up period of the first controller, and monitoring a state of the first battery of the vehicle by maintaining power during a preset first reference time, by the second controller;

a second monitoring operation of, when the first reference time elapses, being woken up at the wake-up period of the first controller, and monitoring the state of the first battery, by the second controller; and after the turning off the main relay: determining not to perform the first monitoring operation by the second controller when not to allowed to check a state of charge (SoC) of a second battery for providing power voltage of the first controller and the second controller, when a SoC of the first battery is lower than a preset reference, or when not allowed to communicate with a low voltage DC-DC converter (LDC) or the first controller for dropping a voltage of the first battery and applying the voltage to the second battery.

6. The method of claim 5, wherein:

the first monitoring operation comprises determining the wake-up period of the first controller to a preset first wake-up period, by the second controller; and the second monitoring operation comprises being woken up by the first controller woken up at the first wake-up period during a preset second reference time at a time when the first reference time elapses, and setting the wake-up period of the first controller to a second wake-up period longer than the first wake-up period and being woken up by the first controller woken up at the second wake-up period after the second reference time elapses, by the second controller.

7. The method of claim 5, wherein the first monitoring operation comprises:

checking whether the main relay is turned on when the second controller is controlled in a power-on (IG ON) state, by the first controller, and terminating monitoring of the state of the first battery when the main delay is turned on, by the second controller.

8. The method of claim 5, wherein the second monitoring operation comprises, after being woken up, determining a reason of wake-up and monitoring the state of the first battery when the determined reason is the wake-up period set by the first controller, by the second controller.

9. The method of claim 5, wherein the second monitoring operation comprises, after being woken up, determining a reason of wake-up, checking whether the main relay is turned on when the determined reason is the external input rather than the wake-up period set by the first controller, and terminating monitoring of the state of the first battery when the main relay is turned on, by the second controller.

10. A method of managing a battery of a vehicle, the method comprising:

when receiving an external input for terminating vehicle driving, controlling a plurality of controllers in the vehicle in a power-off (IG OFF) state, by a first controller;

turning off a main relay connected to a first battery storing energy for generating driving power of the vehicle while maintaining power, by a second controller;

a first monitoring operation of setting a wake-up period of the first controller, and monitoring a state of the first battery of the vehicle by maintaining power during a preset first reference time, by the second controller; and a second monitoring operation of, when the first reference time elapses, being woken up at the wake-up period of the first controller, and monitoring the state of the first battery, by the second controller, wherein the second monitoring operation comprises, after being woken up, determining a reason of wake-up, checking whether the main relay is turned on when the determined reason is the external input rather than the wake-up period set by the first controller, and terminating monitoring of the state of the first battery when the main relay is turned on, by the second controller.

* * * * *